(12) United States Patent
Ramani et al.

(10) Patent No.: US 8,542,523 B2
(45) Date of Patent: Sep. 24, 2013

(54) METHOD FOR FABRICATING A DRAM CAPACITOR HAVING INCREASED THERMAL AND CHEMICAL STABILITY

(71) Applicant: Intermolecular Inc., San Jose, CA (US)

(72) Inventors: Karthik Ramani, Santa Clara, CA (US); Wim Y. Deweerd, San Jose, CA (US); Hiroyuki Ode, Higashihiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/738,855

(22) Filed: Jan. 10, 2013

(65) Prior Publication Data

US 2013/0119515 A1   May 16, 2013

Related U.S. Application Data

(63) Continuation of application No. 13/107,087, filed on May 13, 2011, now Pat. No. 8,243,507.

(51) Int. Cl.
*G11C 11/00* (2006.01)
(52) U.S. Cl.
USPC .......................................... 365/148; 977/754
(58) Field of Classification Search
USPC ............ 365/46, 94, 100, 113, 129, 148, 163; 257/2–5, 296, E31.047, E27.006; 438/29, 438/95, 96, 166, 259, 365, 482, 486, 597; 977/753
See application file for complete search history.

(56) References Cited

U.S. PATENT DOCUMENTS

2007/0121363 A1* 5/2007 Lung ............................. 365/129

* cited by examiner

*Primary Examiner* — Harry W Byrne

(57) ABSTRACT

A method for fabricating a dynamic random access memory (DRAM) capacitor includes forming a first electrode film. The first electrode film comprises a conductive binary metal compound and a dopant. The dopant may have a uniform or non-uniform concentration within the first electrode film. A high-k dielectric film is formed over the first electrode film. A second electrode film is formed over the dielectric film. The second electrode film comprises a conductive binary metal compound and a dopant. The dopant may have a uniform or non-uniform concentration within the second electrode film. The dopants and their distribution are chosen so that the crystal structure of the surface of the electrode is not degraded if the electrode is to be used as a templating structure for subsequent layer formation. Additionally, the dopants and their distribution are chosen so that the work function of the electrodes is not degraded.

14 Claims, 8 Drawing Sheets

METHOD FOR FABRICATING A DRAM CAPACITOR HAVING INCREASED THERMAL AND CHEMICAL STABILITY

CROSS-REFERENCE TO RELATED APPLICATIONS

This is a Continuation Application of U.S. patent application Ser. No. 13/107,081, filed on May 13, 2011, which is herein incorporated by reference for all purposes.

This document relates to the subject matter of a joint research agreement between Intermolecular, Inc. and Elpida Memory, Inc.

FIELD OF THE INVENTION

The present invention generally relates to the field of dynamic random access memory (DRAM), and more particularly to electrode processing for improved DRAM performance.

BACKGROUND

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d, and the relative dielectric constant or k-value of the dielectric material. The capacitance is given by:

$$C = \kappa \varepsilon_o \frac{A}{d} \quad \text{(Eqn. 1)}$$

where $\varepsilon_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, SiO$_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the SiO$_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of SiO$_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

A figure of merit in DRAM technology is the electrical performance of the dielectric material as compared to SiO$_2$ known as the Equivalent Oxide Thickness (EOT). A high-k material's EOT is calculated using a normalized measure of silicon dioxide (SiO$_2$ k=3.9) as a reference, given by:

$$EOT = \frac{3.9}{\kappa} \cdot d \quad \text{(Eqn. 2)}$$

where d represents the physical thickness of the capacitor dielectric.

As DRAM technologies scale below the 40 nm technology node, manufacturers must reduce the EOT of the high-k dielectric films in MIM capacitors in order to increase charge storage capacity. The goal is to utilize dielectric materials that exhibit an EOT of less than about 0.8 nm while maintaining a physical thickness of about 5-20 nm.

One class of high-k dielectric materials possessing the characteristics required for implementation in advanced DRAM capacitors are high-k metal oxide materials. Titanium dioxide (TiO$_2$) is a metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of TiO$_2$, the anatase crystalline phase of TiO$_2$ has a dielectric constant of approximately 40, while the rutile crystalline phase of TiO$_2$ can have a dielectric constant of approximately >80. Due to the higher-k value of the rutile-phase, it is desirable to produce TiO$_2$ based DRAM capacitors with the TiO$_2$ in the rutile-phase. The relative amounts of the anatase phase and the rutile phase can be determined from x-ray diffraction (XRD). From Eqn. 1 above, a TiO$_2$ layer in the rutile-phase could be physically thicker and maintain the desired capacitance. The increased physical thickness is important for lowering the leakage current of the capacitor. The anatase phase will transition to the rutile phase at high temperatures (>800 C). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Therefore, there is a need to develop a DRAM electrode which promotes the growth of the rutile-phase in a $TiO_2$ dielectric layer during formation of the dielectric layer. Such a DRAM electrode would enable a DRAM capacitor with high cell capacitance, small area, low leakage current, and fast device speed.

Generally, as the dielectric constant of a material increases, the band gap of the material decreases. This leads to high leakage current in the device. As a result, without the utilization of countervailing measures, capacitor stacks implementing high-k dielectric materials may experience large leakage currents. High work function electrodes (e.g., electrodes having a work function of greater than 5.0 eV) may be utilized in order to counter the effects of implementing a reduced band gap high-k dielectric layer within the DRAM capacitor. Metals, such as platinum, gold, ruthenium, and ruthenium oxide are examples of high work function electrode materials suitable for inhibiting device leakage in a DRAM capacitor having a high-k dielectric layer. The noble metal systems, however, are prohibitively expensive when employed in a mass production context. Moreover, electrodes fabricated from noble metals often suffer from poor manufacturing qualities, such as surface roughness, poor adhesion, and form a contamination risk in the fab.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$. For example, $MoO_3$ (the most oxygen-rich phase) has an orthorhombic crystal structure.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. The $MoO_{2+x}$ phases may form during the deposition of the electrode and may not be evenly distributed throughout the layer thickness. The $MoO_2$ electrode material may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Typically, the $MoO_2$ electrode material must be annealed after formation to fully crystallize the film. Even if the anneal is performed under an inert gas such as nitrogen, the presence of $MoO_{2+x}$ phases are observed and the effective k-value of the $TiO_2$ dielectric subsequently formed on such an electrode is lower than desired.

Additionally, DRAM capacitor stacks may undergo various refinement process steps after fabrication. These refinement processes may include post-fabrication chemical and thermal processing (i.e., oxidation or reduction). For instance, after initial DRAM capacitor stack fabrication, a number of high temperature (up to about 600 C) processes may be applied to complete the device fabrication. During these subsequent process steps, the DRAM electrode materials must remain chemically, physically, and structurally stable. They must maintain the structural, compositional, physical, and electrical properties that have been developed. Furthermore, they should not undergo significant interaction or reaction with the dielectric layer which may degrade the performance of the DRAM capacitor.

Binary conductive metal oxide materials may not exhibit the required chemical and thermal stability under the various processing steps implemented during fabrication to be used as high quality capacitor electrodes. Therefore, there is a need to produce an electrode system that exhibits good conductivity, a high work function, morphological properties (i.e. roughness), and a crystal structure adequate for templating the preferred crystal phases of subsequently formed high-k dielectric materials, while simultaneously exhibiting good structural, compositional, physical, and electrical stability during subsequent thermal processing.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION OF THE INVENTION

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention. Reference will now be made in detail to the subject matter disclosed, which is illustrated in the accompanying drawings.

Figure 1:
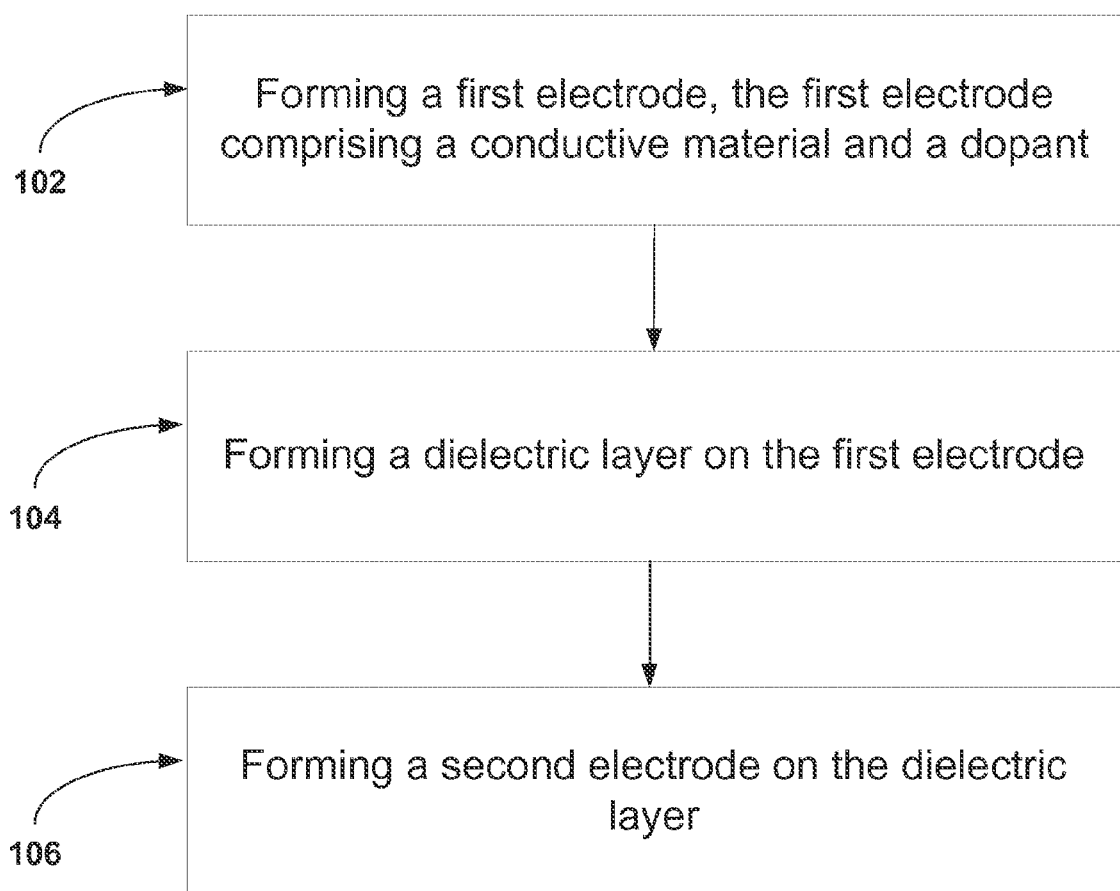
FIG. 1 illustrates a flow chart illustrating a method for fabricating a DRAM capacitor stack, in accordance with some embodiments of the present invention.

FIG. 1 describes a method, 100, for fabricating a DRAM capacitor stack. The initial step, 102, comprises forming a first electrode layer. Examples of suitable electrode materials comprise conductive metal oxides, conductive metal silicides, conductive metal nitrides, and combinations thereof. A particularly interesting class of materials is the conductive metal oxides. Generally, these conductive metal oxide materials also contain oxygen-rich components. The first electrode material further comprises the addition of a dopant. As used herein, a "dopant" is a minor constituent (generally <10 atomic %) of a layer or material that is purposely added. As used herein, the dopant may be electrically active or not electrically active. The definition excludes residues and impurities such as carbon, etc. that may be present in the material due to inefficiencies of the process or impurities in the precursor materials.

Dopants can be added to the conductive metal oxides to form ternary material systems. Examples of these potential dopant materials include Si, Al, Ge, or other metals (i.e. Sn, Ni, Ru, Ta, Re, Rh, Y, Zr, W, etc.). Additional dopants can be added to the ternary material systems to form quaternary material systems. Examples of these potential dopant materials include Si, Al, metals, B, C, N (to form borides, carbides, nitrides), or combinations thereof.

In some embodiments, the dopant may be interspersed within the first electrode material as it is formed (i.e. co-deposited) or layered in step 102. The dopant may be formed as a unique layer during the formation of the electrode structure or may be co-deposited along with the primary electrode material. If the dopant is formed as a unique layer, it may be deposited first, deposited in the middle of the electrode structure, or may be deposited on top of the primary electrode material.

The dopants will tend to form ternary or quaternary material systems with the two major components of the electrode material. Generally, these systems will exhibit better compositional and thermal stability than their undoped binary counterparts. However, it is important that the addition of the dopant does not degrade the crystal structure of the electrode material if the electrode material is to be used as a templating layer for the formation of a desired dielectric crystal structure. Furthermore, the addition of the dopant should not lower the work function of the electrode material and negatively impact the leakage current performance of the device.

It is further recognized that after the formation of the first electrode, an annealing process may be implemented in order to ensure that the composition and crystalline phase of the first electrode material is suitable for templating subsequently deposited high-k dielectric materials. One example of such an annealing process is further described in U.S. application Ser. No. 13/084,666 filed on Apr. 12, 2011, entitled "METHOD FOR FABRICATING A DRAM CAPACITOR" and is incorporated herein by reference.

Returning to FIG. 1, the next step, 104, comprises forming a dielectric material on the first electrode layer. Optionally, the dielectric material may undergo a post dielectric anneal (PDA) treatment (not shown). The next step, 106, comprises forming a second electrode layer on the dielectric layer. Optionally, the DRAM capacitor stack may undergo a post metallization anneal (PMA) treatment (not shown). Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference.

Those skilled in the art will appreciate that each of the first electrode layer, the dielectric layer, and the second electrode layer may be formed using well known techniques such as ALD, PE-ALD, AVD, UV-ALD, CVD, PECVD, or PVD. Generally, because of the complex morphology of the DRAM capacitor structure, ALD, PE-ALD, AVD, or CVD are preferred methods of layer formation. However, any of these techniques are suitable for forming each of the various layers discussed below. Those skilled in the art will appreciate that the teachings described below are not limited by the technology used for the formation process.

In FIGS. 2-5 and 7-8 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 2:
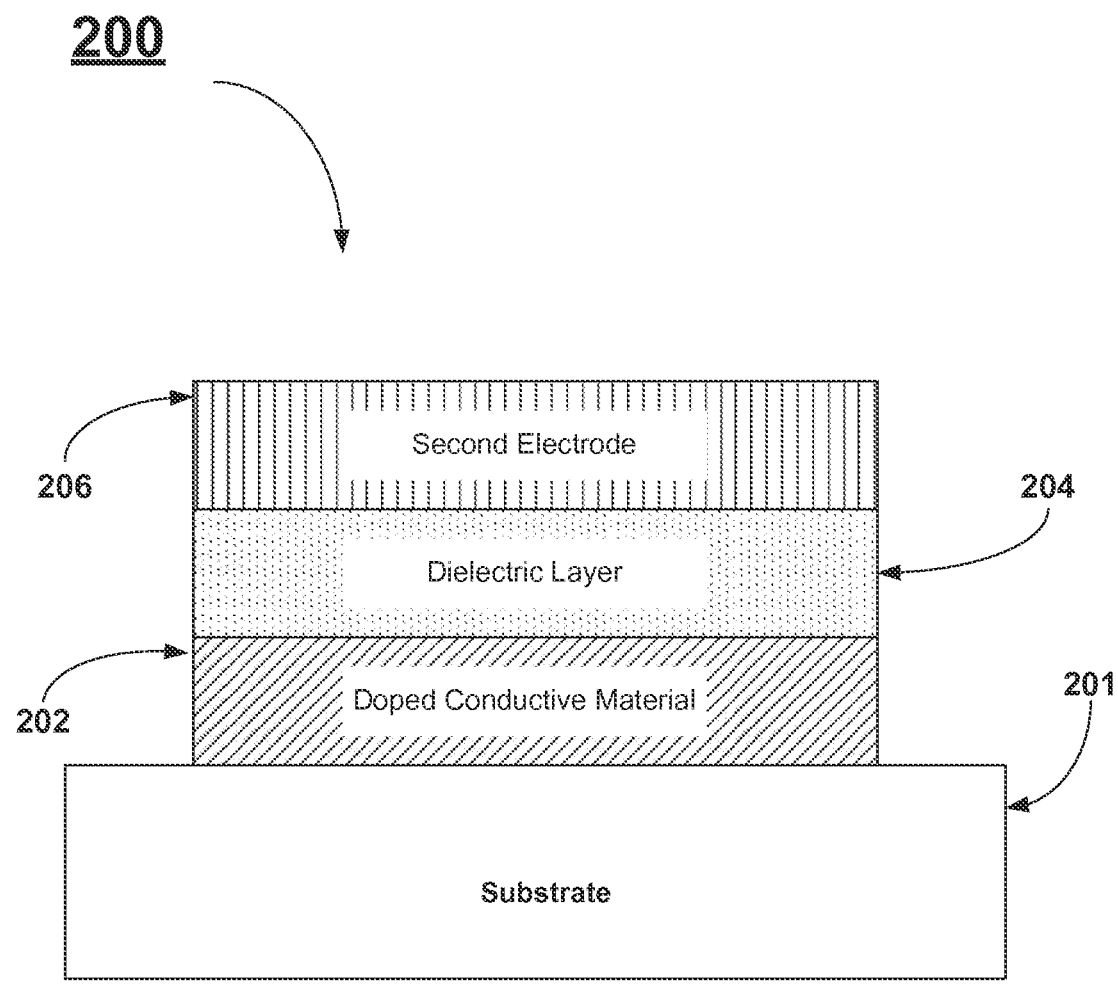
FIG. 2 illustrates a simplified cross-sectional view of a DRAM capacitor stack fabricated in accordance with some embodiments of the present invention.

FIG. 2 illustrates a simple capacitor stack, 200, consistent with some embodiments of the present invention. Using the method as outlined in FIG. 1 and described above, first electrode layer, 202, is formed on substrate, 201. Generally, the substrate has already received several processing steps in the manufacture of a full DRAM device. The first electrode may be any conductive material and includes dopant materials up to about 10 atomic %. A class of materials of interest is the conductive metal oxides. Examples of the conductive metal oxides include the conductive compounds of molybdenum oxide, tungsten oxide, ruthenium oxide, rhenium oxide, chromium oxide, rhodium oxide, iridium oxide, manganese oxide, tin oxide, cobalt oxide, or nickel oxide. A specific electrode material of interest is $MoO_2$.

The dopant materials may be co-deposited with the bulk electrode material or may be introduced as one or more unique sub-layers. For example, if the electrode formation technology is ALD, AVD, or PE-ALD, the dopant precursor(s) can be introduced in the same pulse as the metal precursor of the electrode material or the dopant precursor(s) can be introduced in separate pulses. If the electrode formation technology is PVD, the dopant material(s) can be either co-sputtered or formed as a separate layer during the formation of the electrode. Typically, the first electrode is annealed before proceeding to the formation of the dielectric material.

In the next step, dielectric layer, 204, would then be formed on the first electrode layer, 202. A wide variety of dielectric materials have been targeted for use in DRAM capacitors. Examples of suitable dielectric materials comprise $SiO_2$, $SiO_2/Si_xN_y$, SiON, $Al_2O_3$, $HfO_2$, $HfSiO_x$, $ZrO_2$, $Ta_2O_5$, $TiO_2$, $SrTiO_3$ (STO), $SrBaTiO_x$ (SBT), $PbZrTiO_x$ (PZT) or doped versions of the same such as $Al:TiO_2$. These dielectric materials may be formed as a single layer or may be formed as a hybrid or nanolaminate structure. Optionally, the dielectric layer may now receive a PDA treatment. A specific dielectric material of interest is the rutile-phase of $TiO_2$.

In the next step, the second electrode layer, 206, is formed on dielectric layer, 204. The second electrode layer may be a conductive binary metal compound material as described above, a metal, or a combination thereof. Optionally, the DRAM capacitor stack may now receive a PMA treatment. The remaining full DRAM device (not shown) would then be manufactured using well known techniques.

Figure 3:
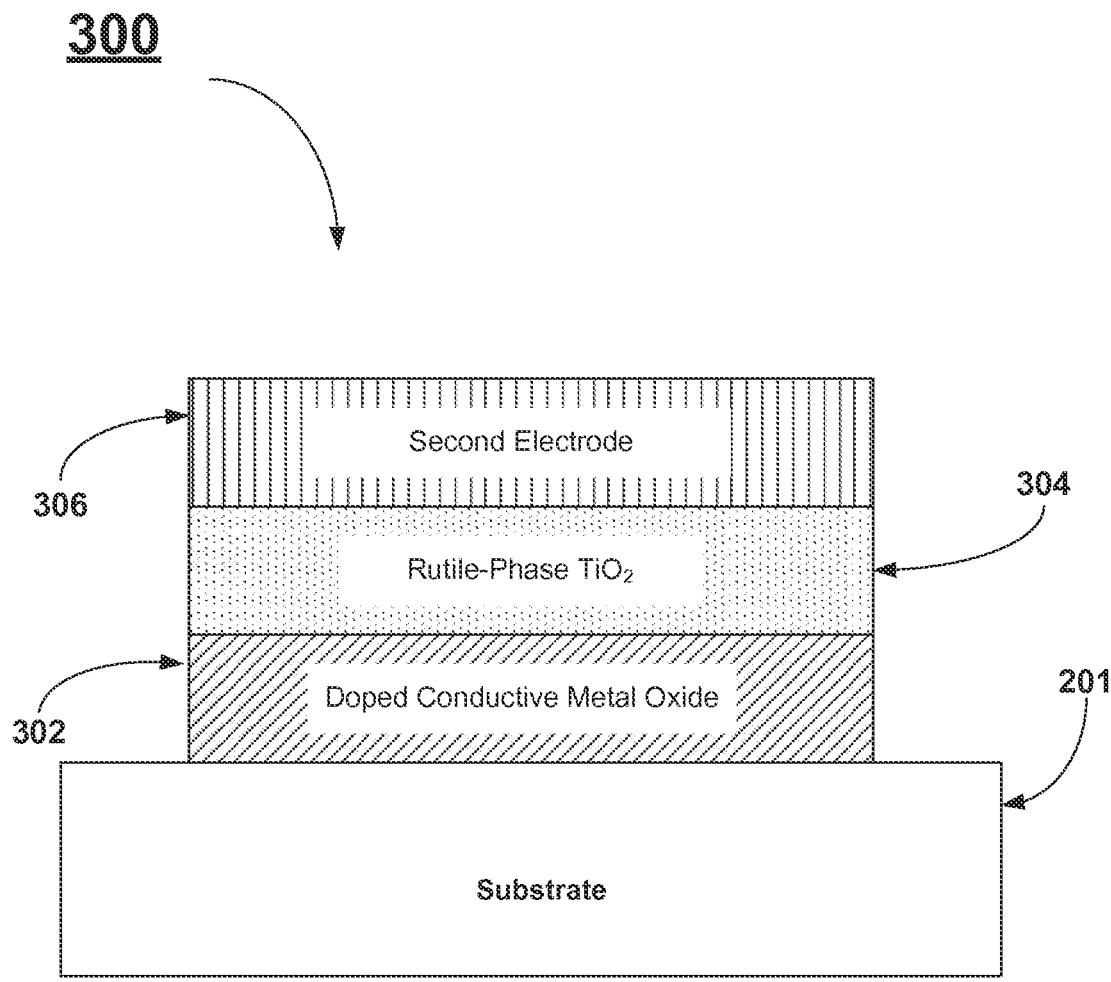
FIG. 3 illustrates a simplified cross-sectional view of a DRAM capacitor stack fabricated in accordance with some embodiments of the present invention.

FIG. 3 illustrates a specific example of a simple capacitor stack, 300, consistent with some embodiments of the present invention. Using the method as outlined in FIG. 1 and described above, first electrode layer, 302, is formed on substrate, 201. Generally, the substrate has already received several processing steps in the manufacture of a full DRAM device. One class of materials that is of interest as a DRAM electrode is the conductive metal oxides. Examples of the conductive metal oxides include the conductive compounds of molybdenum oxide, tungsten oxide, ruthenium oxide, rhenium oxide, chromium oxide, rhodium oxide, iridium oxide, manganese oxide, tin oxide, cobalt oxide, or nickel oxide. As a specific example, first electrode layer, 302, comprises a $MoO_2$ material that also contains one or more dopant materials. Specific dopant materials comprise Si, Al, or other transition metals. The goal is to maximize the amount of $MoO_2$ present in first electrode layer, 302, because it has a distorted rutile crystal structure and would serve as a good template to promote the growth of the rutile-phase of a $TiO_2$ dielectric material in a later step. A second goal is to ensure that the work function of the $MoO_2$ electrode material remains above ~5.0 eV. The presence of oxygen-rich materials ($MoO_{2+x}$) is to be minimized because they generally do not promote the growth of the rutile-phase crystal structure of the $TiO_2$ dielectric material and can decrease the work function. Typically, the first electrode is annealed before proceeding to the formation of the dielectric material.

In the next step, dielectric layer, 304, would then be formed on the first electrode layer, 302. In this example, a layer of $TiO_2$ that is predominantly (>30% as determined by XRD) in the rutile-phase is formed as the dielectric layer, 304. The rutile-phase of $TiO_2$ grows preferentially over the anatase-phase due to the distorted rutile-phase crystal structure of the underlying predominantly $MoO_2$ electrode material. The $TiO_2$ layer generally has a physical layer thickness between 5 nm and 20 nm and exhibits a k value of >40. Optionally, the dielectric layer may now receive a PDA treatment.

In the next step, the second electrode layer, 306, is formed on dielectric layer, 304. The second electrode layer may be a conductive binary metal compound material as described above, a metal, or a combination thereof. Advantageously, the second electrode is also doped. The dopant may be the same or different from the dopant used in the first electrode. In this example, the second electrode layer, 306, comprises a conductive binary metal oxide material. Optionally, the DRAM capacitor stack may now receive a PMA treatment. The remaining full DRAM device (not shown) would then be manufactured using well known techniques.

Figure 4:
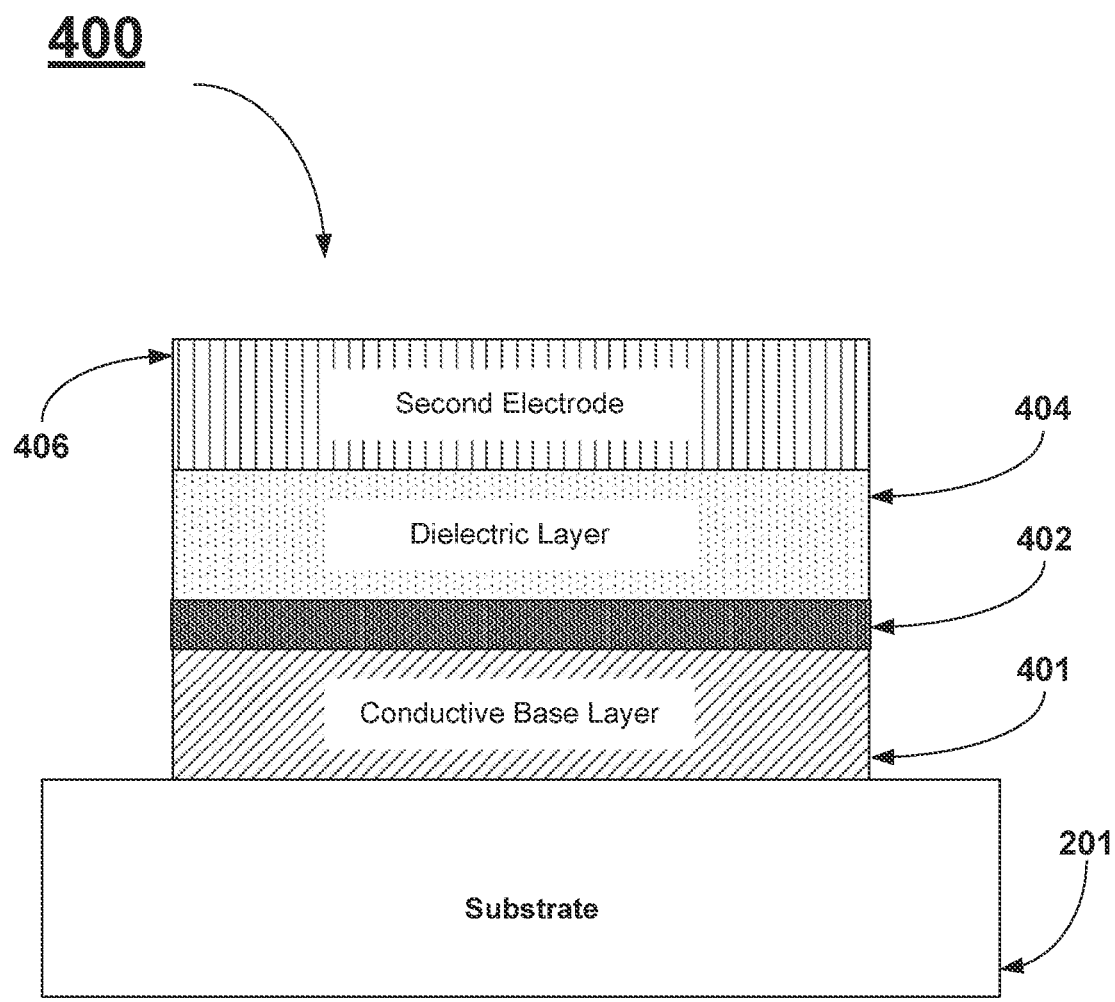
FIG. 4 illustrates a simplified cross-sectional view of a DRAM capacitor stack fabricated in accordance with some embodiments of the present invention.

FIG. 4 illustrates a simple capacitor stack, 400, consistent with some embodiments of the present invention. In this illustration, only a thin layer of the conductive binary metal compound is used on top of a previously deposited conductive base layer, 401, to form the first electrode. The thin layer of the conductive binary metal compound also includes one or more dopant materials. The base layer may be a metal or highly conductive material such as TiN, TaN, TiAlN, Al, Cu, W, WN or the like. Using the method as outlined in FIG. 1 and described above, doped thin first electrode layer, 402, is formed on base layer, 401. Generally, the substrate has already received several processing steps in the manufacture of a full DRAM device. In this example, doped thin first electrode layer, 402, comprises a conductive metal oxide material. Examples of the conductive metal oxides include molybdenum oxide, tungsten oxide, ruthenium oxide, rhenium oxide, chromium oxide, rhodium oxide, iridium oxide, manganese oxide, tin oxide, cobalt oxide, or nickel oxide. Typically, the first electrode is annealed before proceeding to the formation of the dielectric material.

In the next step, dielectric layer, 404, would then be formed on the doped thin first electrode layer, 402. A wide variety of dielectric materials have been targeted for use in DRAM capacitors. Examples of suitable dielectric materials comprise $SiO_2$, $SiO_2/Si_xN_y$, SiON, $HfO_2$, $ZrO_2$, $Ta_2O_5$, $TiO_2$, $SrTiO_3$ (STO), $SrBaTiO_x$ (SBT), $PbZrTiO_x$ (PZT) or doped versions of the same such as $Al:TiO_2$. These dielectric materials may be formed as a single layer or may be formed as a hybrid or nanolaminate structure. Optionally, the dielectric layer may now receive a PDA treatment.

In the next step, the second electrode layer, 406, is formed on dielectric layer, 404. The second electrode layer may be a binary metal compound material as described above, a metal, or a combination thereof. The second electrode layer, 406, may also be doped. Optionally, the DRAM capacitor stack may now receive a PMA treatment. The remaining full DRAM device (not shown) would then be manufactured using well known techniques.

Figure 5:
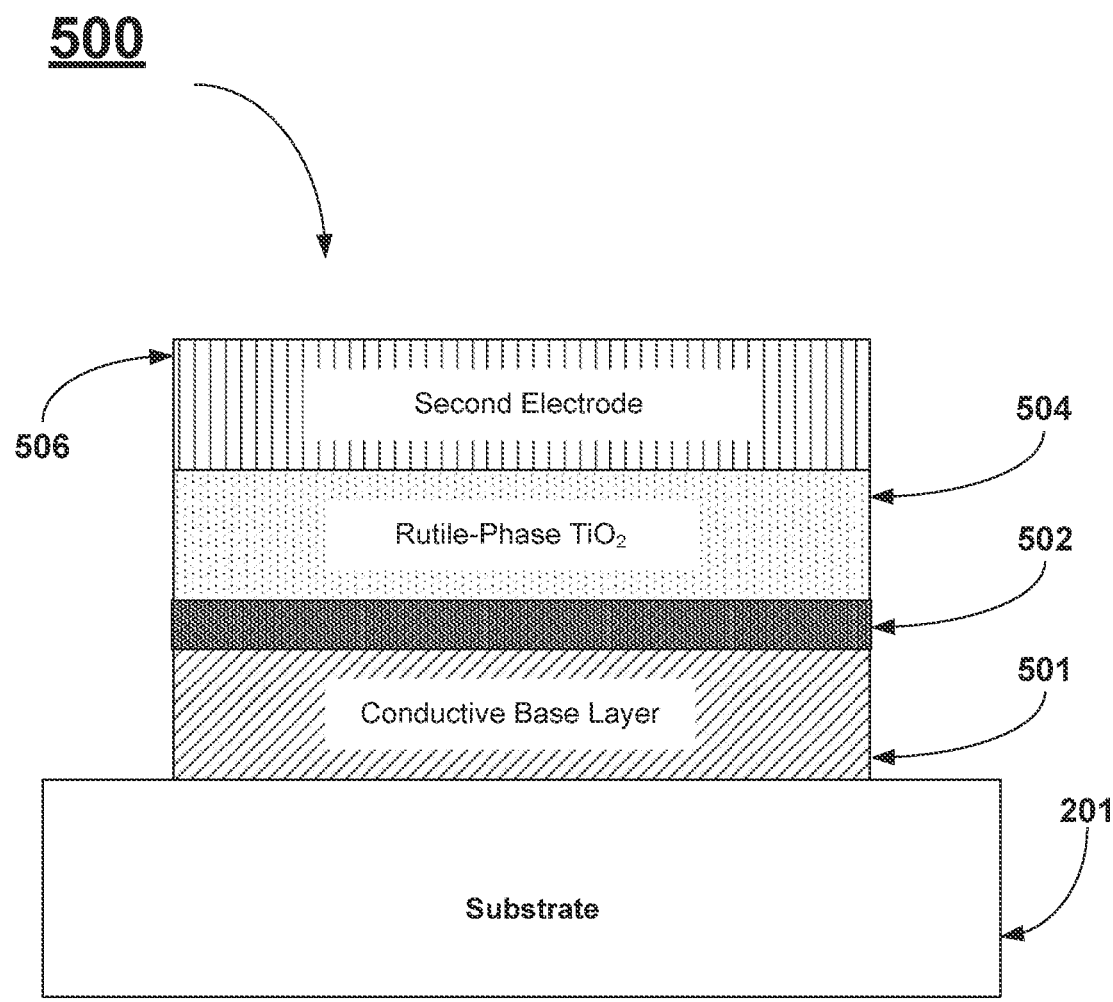
FIG. 5 illustrates a simplified cross-sectional view of a DRAM capacitor stack fabricated in accordance with some embodiments of the present invention.

FIG. 5 illustrates a specific example of a simple capacitor stack, 500, consistent with some embodiments of the present invention. In this illustration, only a thin layer of the doped conductive binary metal compound is formed on top of a previously deposited conductive base layer, 501, to form the first electrode. The base layer may be a metal or highly conductive material such as TiN, TaN, TiAlN, Al, Cu, W, WN or the like. Using the method as outlined in FIG. 1 and described above, doped thin first electrode layer, 502, is formed on base layer, 501. Generally, the substrate has already received several processing steps in the manufacture of a full DRAM device. In this example, doped thin first electrode layer, 502, comprises a $MoO_2$ and one or more dopants. Specific dopant materials comprise Si, Al, or other transition metals. The doped thin first electrode layer, 502, may have a thickness between about 0.5 nm and 5 nm. One goal is to maximize the amount of $MoO_2$ present in the doped thin first electrode layer, 502, because it has a distorted rutile crystal structure and would serve as a good template to promote the growth of rutile-phase $TiO_2$ dielectrics in a later deposition step. Typically, the first electrode is annealed before proceeding to the formation of the dielectric material.

In the next step, dielectric layer, 504, would then be formed on the doped thin first electrode layer, 502. In this example, a layer of $TiO_2$ that is predominantly (>30% as determined by XRD) in the rutile-phase is formed as the dielectric layer, 504. The rutile-phase of $TiO_2$ grows preferentially over the anatase-phase due to the distorted rutile-phase crystal structure of the underlying predominantly $MoO_2$ doped thin first electrode material. The $TiO_2$ layer generally has a thickness between 5 nm and 20 nm and exhibits a k value of >40. Optionally, the dielectric layer may now receive a PDA treatment.

In the next step, the second electrode layer, 506, is formed on dielectric layer, 504. The second electrode layer may be a binary metal compound material as described above, a metal, or a combination thereof. In this example, the second electrode layer, 506, comprises a doped conductive binary metal oxide material. Optionally, the DRAM capacitor stack may now receive a PMA treatment. The remaining full DRAM device (not shown) would then be manufactured using well known techniques.

Figure 6:
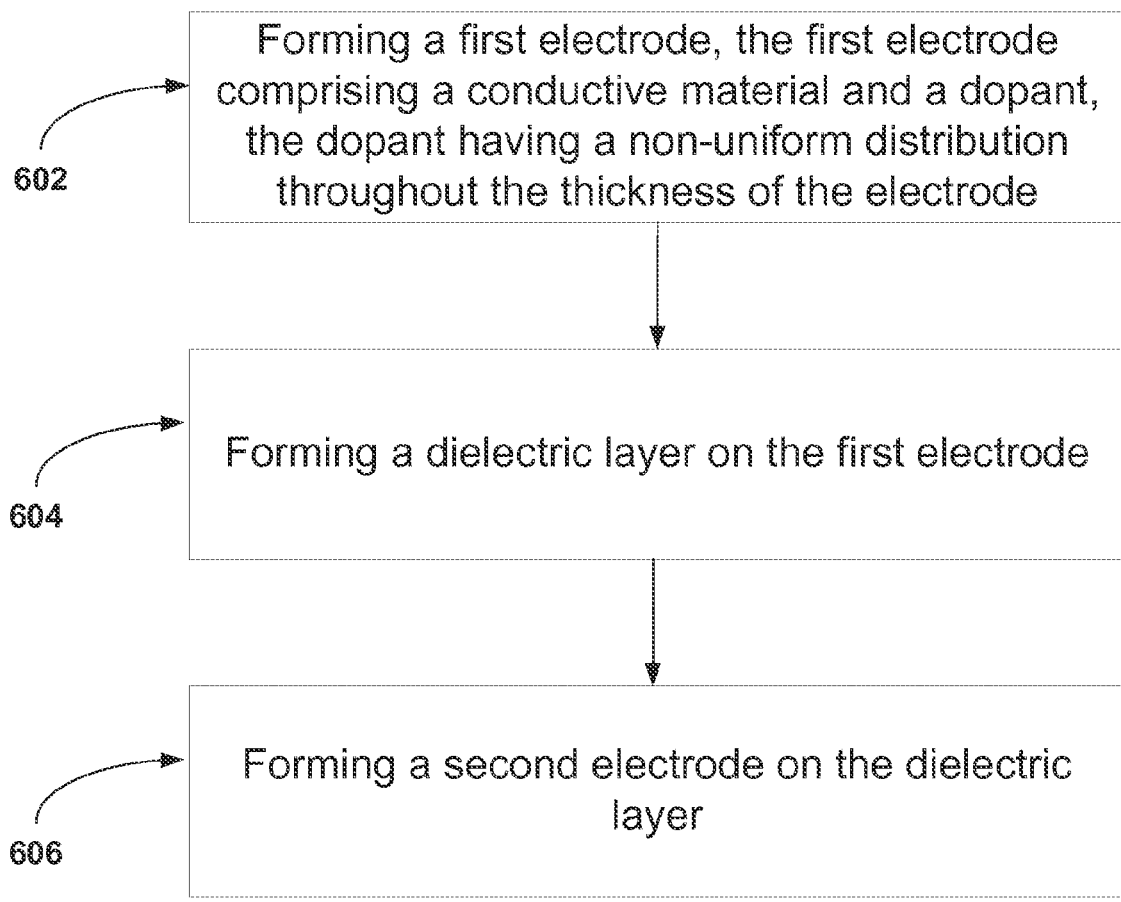
FIG. 6 illustrates a flow chart illustrating a method for fabricating a DRAM capacitor stack, in accordance with some embodiments of the present invention.

FIG. 6 describes a method, 600, for fabricating a DRAM capacitor stack. The initial step, 602, comprises forming a first electrode layer. Examples of suitable electrode materials comprise conductive metal oxides, conductive metal silicides, conductive metal nitrides, and combinations thereof. A particularly interesting class of materials is the conductive metal oxides. The first electrode material further comprises the addition of one or more dopants in a concentration up to about 10 atomic %. In this embodiment, the dopant is not distributed uniformly throughout the first electrode layer. For example, the concentration of the dopant can be adjusted so it is higher within the bulk of the first electrode layer than at the top surface of the first electrode layer. This may have a number of advantages. As discussed previously, the addition of the dopant increases the stability of the electrode material during subsequent high temperature steps. Therefore, the dopant in the bulk of the first electrode material will increase the stability of the layer. However, the dopant must not significantly alter the desired crystal structure of the top surface of the first electrode and must not decrease the work function of the electrode. By reducing the concentration of the dopant at the top surface of the electrode, the dopant will have a small effect on the crystal structure of the surface and the work function of the electrode.

The variation of the concentration of the dopant may assume many forms. In some embodiments, the concentration may vary in a linear fashion where it is highest at the bottom of the first electrode layer (i.e. closest to the substrate) and is lowest at the top surface (i.e. in contact with the dielectric layer). In some embodiments, the concentration may be held at a constant level from the bottom of the first electrode layer to some distance into the electrode layer and then abruptly decrease to a lower level for the remaining thickness. In this case, the concentration would vary in a step function manner. In some embodiments, the concentration may be lowest at both the top and bottom surfaces of the first electrode layer and highest within the bulk of the layer. Those skilled in the art will realize that these are just a few examples of how the variation of the concentration of the dopant can be devised. Typically, the first electrode is annealed before proceeding to the formation of the dielectric material.

Returning to FIG. 6, the next step, 604, comprises forming a dielectric material on the first electrode layer. Optionally, the dielectric layer may now receive a PDA treatment. The next step, 606, comprises forming a second electrode layer on the dielectric layer. The second electrode layer may be a binary metal compound material as described above, a metal, or a combination thereof. The second electrode layer, 606, may also be doped. Optionally, the DRAM capacitor stack may now receive a PMA treatment.

Figure 7:
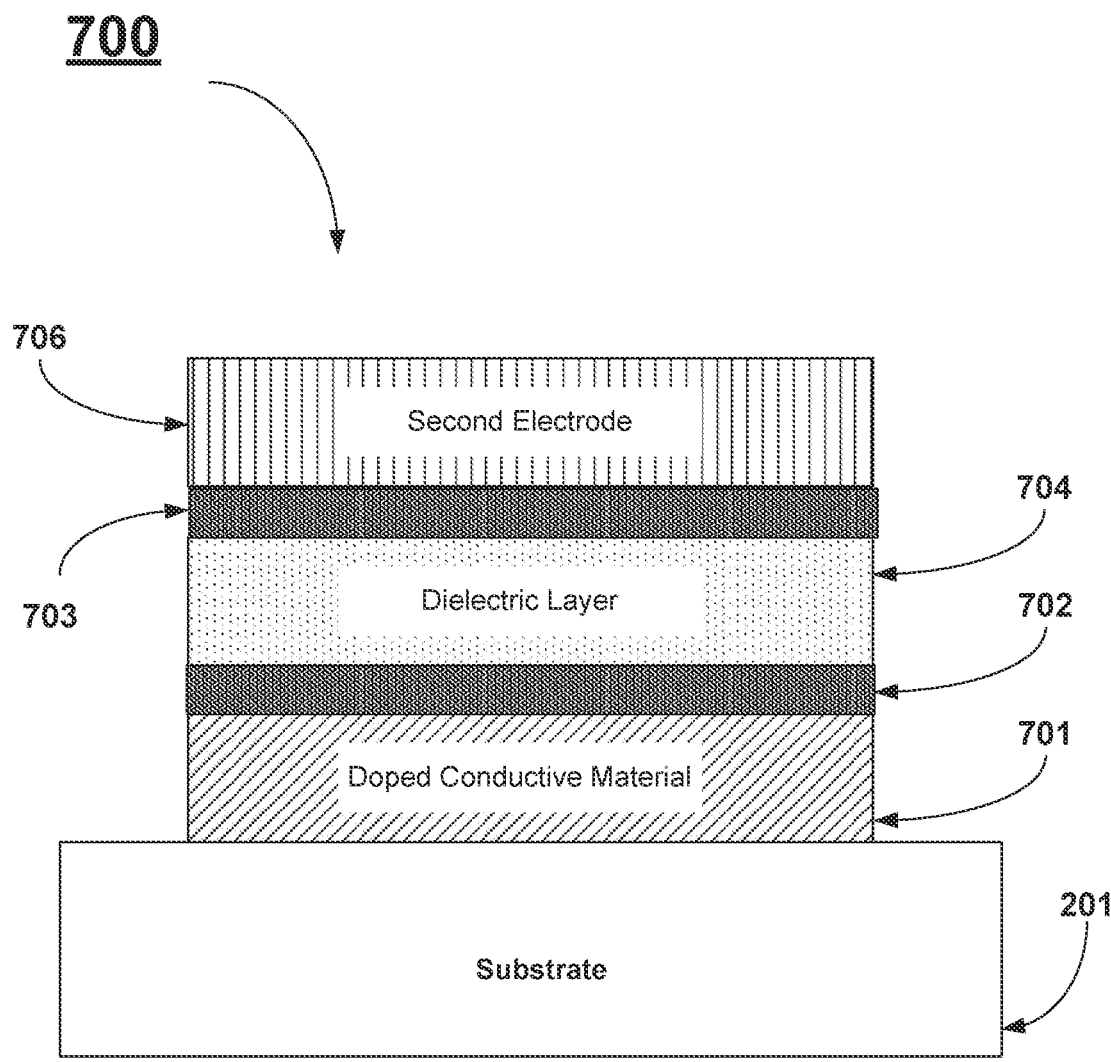
FIG. 7 illustrates a simplified cross-sectional view of a DRAM capacitor stack fabricated in accordance with some embodiments of the present invention.

FIG. 7 illustrates a simple capacitor stack, 700, consistent with some embodiments of the present invention. Using the method as outlined in FIG. 6 and described above, first electrode layer, 701/702, is formed on substrate, 201. Generally, the substrate has already received several processing steps in the manufacture of a full DRAM device. The first electrode may be any conductive material and includes dopant materials up to about 10 atomic %. The concentration of the dopant is non-uniform within first electrode layer, 701/702. This concept is illustrated schematically in FIG. 7 wherein layer 701 has a different dopant concentration from layer 702. The variation of the concentration of the dopant may assume many forms as discussed previously. A specific electrode material of interest is $MoO_2$.

The dopant materials may be co-deposited with the bulk electrode material or may be introduced as one or more unique sub-layers. For example, if the electrode formation technology is ALD, AVD, or PE-ALD, the dopant precursor(s) can be introduced in the same pulse as the metal precursor of the electrode material or the dopant precursor(s) can be introduced in separate pulses. If the electrode formation technology is PVD, the dopant material(s) can be either co-sputtered or formed as a separate layer during the formation of the electrode. Typically, the first electrode is annealed before proceeding to the formation of the dielectric material.

In the next step, dielectric layer, 704, would then be formed on the first electrode layer, 701/702. A wide variety of dielectric materials have been targeted for use in DRAM capacitors. Examples of suitable dielectric materials comprise $SiO_2$, $SiO_2/Si_xN_y$, SiON, $Al_2O_3$, $HfO_2$, $HfSiO_x$, $ZrO_2$, $Ta_2O_5$, $TiO_2$ $SrTiO_3$ (STO), $SrBaTiO_x$ (SBT), $PbZrTiO_x$ (PZT) or doped versions of the same such as $Al:TiO_2$. These dielectric materials may be formed as a single layer or may be formed as a hybrid or nanolaminate structure. A specific dielectric material of interest is the rutile-phase of $TiO_2$. Optionally, the dielectric layer may now receive a PDA treatment.

In the next step, the second electrode layer, 706/703, is formed on dielectric layer, 704. The second electrode layer may be a conductive binary metal compound material and includes dopant materials up to about 10 atomic %. The concentration of the dopant is non-uniform within second electrode layer, 706/703. This concept is illustrated schematically in FIG. 7 wherein layer 706 has a different dopant concentration from layer 703. The variation of the concentration of the dopant may assume many forms as discussed previously. Optionally, the DRAM capacitor stack may now receive a PMA treatment. The remaining full DRAM device (not shown) would then be manufactured using well known techniques.

Figure 8:
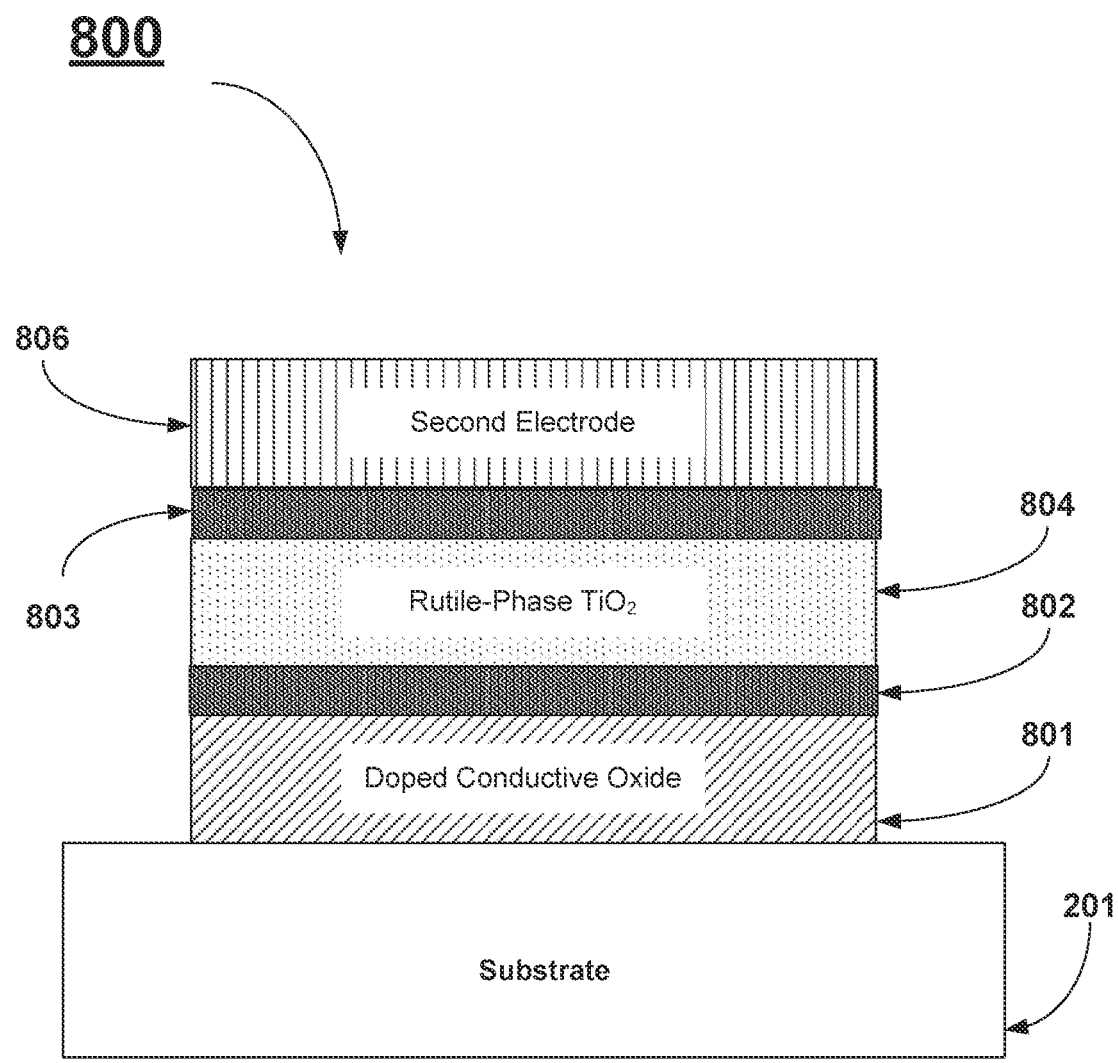
FIG. 8 illustrates a simplified cross-sectional view of a DRAM capacitor stack fabricated in accordance with some embodiments of the present invention.

FIG. 8 illustrates a specific example of a simple capacitor stack, 800, consistent with some embodiments of the present invention. Using the method as outlined in FIG. 6 and described above, first electrode layer, 801/802, is formed on substrate, 201. Generally, the substrate has already received several processing steps in the manufacture of a full DRAM device. One class of materials that is of interest as a DRAM electrode is the conductive metal oxides. Examples of the conductive metal oxides include the conductive compounds of molybdenum oxide, tungsten oxide, ruthenium oxide, rhenium oxide, chromium oxide, rhodium oxide, iridium oxide, manganese oxide, tin oxide, cobalt oxide, or nickel oxide As a specific example, first electrode layer, 801/802, comprises a $MoO_2$ material that also contains one or more dopant materials up to a concentration of about 10 atomic %. The concentration of the dopant is non-uniform within the first electrode layer, 801/802. This concept is illustrated schematically in FIG. 8 wherein layer 801 has a different dopant concentration from layer 802. Layer 801 of the first electrode will have a higher concentration of the dopant. Layer 802 of the first electrode will have a lower concentration of the dopant. Specific dopant materials comprise Si, Al, or other transition metals. The goal is to maximize the amount of crystalline $MoO_2$ present in lightly doped electrode layer, 802, because it has a distorted rutile crystal structure and would serve as a good template to promote the growth of rutile-phase of a $TiO_2$ dielectric material in a later deposition step. A second goal is to ensure that the work function of the $MoO_2$ electrode material remains above ~5.0 eV. The presence of oxygen-rich materials ($MoO_{2+x}$) is to be minimized because they generally do not promote the growth of the rutile-phase crystal structure of the $TiO_2$ dielectric material. Typically, the first electrode is annealed before proceeding to the formation of the dielectric material.

In the next step, dielectric layer, 804, would then be formed on the first electrode layer, 801/802. In this example, a layer of $TiO_2$ that is predominantly (>30% as determined by XRD) in the rutile-phase is formed as the dielectric layer, 804. The rutile-phase of $TiO_2$ grows preferentially over the anatase-phase due to the distorted rutile-phase crystal structure of the underlying predominantly $MoO_2$ electrode material. The $TiO_2$ layer generally has a physical layer thickness between 5 nm and 20 nm and exhibits a k value of >40. Optionally, the dielectric layer may now receive a PDA treatment.

In the next step, the second electrode layer, 806/803, is formed on dielectric layer, 804. The second electrode layer may be a conductive binary metal compound material as described above, a metal, or a combination thereof. Advantageously, the second electrode is also doped up to a concentration of about 10 atomic %. The dopant may be the same or different from the dopant used in the first electrode. In this example, the second electrode layer, 806/803, comprises a conductive binary metal oxide material. The concentration of the dopant is non-uniform within the second electrode layer, 806/803. This concept is illustrated schematically in FIG. 8 wherein layer 806 has a different dopant concentration from layer 803. Layer 806 of the second electrode will have a higher concentration of the dopant. Layer 803 of the second electrode will have a lower concentration of the dopant. Specific dopant materials comprise Si, Al, or other transition metals. Optionally, the DRAM capacitor stack may now receive a PMA treatment. The remaining full DRAM device (not shown) would then be manufactured using well known techniques.

The methods disclosed above may be used in the manufacture of a semiconductor device. The device will comprise a plurality of memory cells. Each memory cell will comprise at least one capacitor. Each capacitor will comprise a DRAM capacitor stack fabricated using the above described methods. For example, a DRAM capacitor stack fabricated in accordance with the present invention using a $TiO_2$ dielectric layer with a k value of >40 and a physical thickness of 5-20 nm will have an EOT of less than 0.8 nm (from Eqn. 2 above), while providing adequate charge retention characteristics. Moreover, the doped conductive metal oxide (e.g., $MoO_2$) based first electrodes of the present invention may have a work function greater than 5.1 eV leading to reduced leakage current. Additionally, a DRAM capacitor stack fabricated using the above described methods of the present invention and having a physical thickness of less than 20 nm is achievable via ALD, PE-ALD, AVD, UV-ALD, CVD, PECVD, or PVD.

Although various embodiments that incorporate the teachings of the present invention have been shown and described in detail herein, those skilled in the art can readily devise many other varied embodiments that still incorporate these teachings.

What is claimed:

1. A semiconductor layer stack comprising:
a first electrode layer formed on a substrate, the first electrode layer comprising a first electrode material and a dopant;
a dielectric layer formed on the first electrode layer; and
a second electrode layer formed on the dielectric layer.

2. The semiconductor layer stack of claim 1, wherein the first electrode layer comprises one of conductive metal oxides, conductive metal silicides, conductive metal nitrides, or combinations thereof.

3. The semiconductor layer stack of claim 2, wherein the conductive metal oxide comprises one of molybdenum oxide, ruthenium oxide, rhenium oxide, tungsten oxide, rhodium oxide, iridium oxide, chromium oxide, manganese oxide, tin oxide, cobalt oxide, nickel oxide, or combinations thereof.

4. The semiconductor layer stack of claim 3 wherein the conductive metal oxide is molybdenum oxide.

5. The semiconductor layer stack of claim 1 wherein the dopant comprises at least one of Si, Al, Ge, or a transition metal.

6. The semiconductor layer stack of claim 1 wherein the dopant has a non-uniform concentration gradient throughout the first electrode layer.

7. The semiconductor layer stack of claim 6 wherein the concentration of the dopant is lowest at the surface of the first electrode layer that is in contact with the dielectric layer.

8. The semiconductor layer stack of claim 1 wherein the second electrode layer further comprises a second electrode material and a dopant.

9. The semiconductor layer stack of claim 8, wherein the second electrode material comprises one of conductive metal oxides, conductive metal silicides, conductive metal nitrides, or combinations thereof.

10. The semiconductor layer stack of claim 9, wherein the conductive metal oxide comprises one of molybdenum oxide, ruthenium oxide, rhenium oxide, tungsten oxide, rhodium oxide, iridium oxide, chromium oxide, manganese oxide, tin oxide, cobalt oxide, nickel oxide, or combinations thereof.

11. The semiconductor layer stack of claim 10 wherein the conductive metal oxide is molybdenum oxide.

12. The semiconductor layer stack of claim 8 wherein the dopant in the second electrode material comprises one of Si, Al, Ge, or a transition metal.

13. The semiconductor layer stack of claim 8 wherein the dopant in the second electrode material has a non-uniform concentration gradient throughout the second electrode material.

14. The semiconductor layer stack of claim 13 wherein the concentration of the dopant is lowest at the surface of the second electrode material that is in contact with the dielectric layer.

* * * * *